United States Patent
Adame et al.

[19]

[11] Patent Number: 6,058,354
[45] Date of Patent: May 2, 2000

[54] ELECTRICITY METER TO MEASURE ELECTRICAL PHYSICAL MAGNITUDES WHICH ARE PARAMETERS OR FUNCTIONS OF MEASURED VOLTAGES AND/OR CURRENTS

[75] Inventors: Javier Adame, Walchwil, Switzerland; John P. Junker, Lafayette, Ind.; Gordon R. Burns, West Lafayette, Ind.; John Thomas Voisine, Lafayette, Ind.

[73] Assignee: Electrowatt Technology Innovation AG, Zug, Switzerland

[21] Appl. No.: 08/927,386

[22] Filed: Aug. 25, 1997

[51] Int. Cl.$^7$ ...................................................... G01R 7/00
[52] U.S. Cl. ................................ 702/60; 702/61; 702/64; 324/117 H; 324/140 R; 324/141; 324/142
[58] Field of Search ............................... 702/60–62, 58, 702/117, 64, 190, 65, 116, 124, 126, 182–185, 189, 197–199, FOR 106, FOR 107, 75; 324/142, 141, 116, 103 R, 251, 117 H, 74, 140 R, 73.1, 76.11, 118, 115, 76.59; 364/178, 179, 528.27–528.29; 341/166, 123, 118, 77, 110, 155, 126, 122, 143, 180, 144; 340/870.02, 870.16, 870.17, 870.18, 870.21; 708/313, 316; 710/69; 712/36; 332/101, 103, 117, 127; 327/510, 511; 700/73, 74, 286, 291–298

[56] References Cited

U.S. PATENT DOCUMENTS

| | | |
|---|---|---|
| 4,473,810 | 9/1984 | Souques et al. . |
| 4,672,555 | 6/1987 | Hart et al. . |
| 4,794,369 | 12/1988 | Haferd ...................................... 341/166 |
| 4,884,021 | 11/1989 | Hammond et al. ...................... 324/142 |
| 4,947,108 | 8/1990 | Gudel .................................. 324/117 H |
| 5,122,735 | 6/1992 | Porter et al. ............................. 324/142 |
| 5,212,441 | 5/1993 | McEachern et al. ................... 324/142 |
| 5,298,854 | 3/1994 | McEachern et al. ................... 324/142 |
| 5,298,856 | 3/1994 | McEachern et al. ................... 324/142 |
| 5,298,857 | 3/1994 | Voisine et al. . |
| 5,298,859 | 3/1994 | McEachern et al. ................... 324/142 |
| 5,301,121 | 4/1994 | Garverick et al. . |
| 5,345,409 | 9/1994 | McGrath et al. .......................... 702/60 |
| 5,448,747 | 9/1995 | Garverick et al. ........................ 702/64 |
| 5,594,333 | 1/1997 | Whipple, III ........................... 324/142 |
| 5,606,510 | 2/1997 | Glaser et al. . |
| 5,736,848 | 4/1998 | De Vries et al. ....................... 324/142 |
| 5,742,512 | 4/1998 | Edge et al. . |
| 5,764,523 | 6/1998 | Yoshinaga et al. ..................... 324/141 |

FOREIGN PATENT DOCUMENTS

| | | |
|---|---|---|
| 0 742 442 A2 | 11/1996 | European Pat. Off. . |
| 0 742 443 A2 | 11/1996 | European Pat. Off. . |
| 0 742 444 A2 | 11/1996 | European Pat. Off. . |
| WO 93/17345 | 9/1993 | WIPO . |
| WO 93/17390 | 9/1993 | WIPO . |

*Primary Examiner*—Hal Wachsman
*Attorney, Agent, or Firm*—Proskauer Rose LLP

[57] ABSTRACT

An electricity meter contains analog/digital converters to transform input analog voltages and currents into sampled digital values. A first high speed processor derives auxiliary magnitudes from the sampled digital values without intermediate storage. The auxiliary magnitudes, which do not have any direct physical significance, are provided to a lower speed second processor, which utilizes the auxiliary magnitudes to determine various desired parameters and functions of the input voltages and currents.

22 Claims, 1 Drawing Sheet

ELECTRICITY METER TO MEASURE ELECTRICAL PHYSICAL MAGNITUDES WHICH ARE PARAMETERS OR FUNCTIONS OF MEASURED VOLTAGES AND/OR CURRENTS

FIELD OF THE INVENTION

The present invention relates to an electricity meter which measures and processes the electrical physical magnitudes of voltage and/or current input signals. More specifically, the present invention relates to an electricity meter which measures the frequency, phase, phase differences, energy, power, power factors, etc., of input voltages and/or currents.

BACKGROUND OF THE INVENTION

Electricity meters are often designed as universal (or combination) electricity meters which, in addition to measuring active energy, also measure other types of energy and/or other physical electrical magnitudes, such as frequencies, phases, phase differences, power factors, etc., which are meaningful in connection with electrical power and/or energy measurements. The variety and types of the magnitudes to be determined can vary widely, depending on product and/or country requirements, and in many cases, may not be known in advance, or may need to be modified at a later time. It is also possible that originally pure active energy meters may need to be changed into combination meters or universal electricity meters at a later time.

Electricity meters of the type described above are known from U.S. Pat. No. 4,884,021, U.S. Pat. No. 5,212,441, U.S. Pat. No. 5,298,854, U.S. Pat. No. 5,298,856 and U.S. Pat. No. 5,298,859, in which values of one or several power types are determined in a first processor, and are then converted in a second processor into values of appertaining energy types.

Other published documents, e.g. U.S. Pat. No. 4,794,369, U.S. Pat. No. 5,122,735, WO 93/17345, WO 93/17390, EP 742,442A, EP 742,443A and EP 742,444A, further disclose that values of one or several energy types are determined in a first processor, and are then transmitted to a second processor, either in the form of digital values, or in the form of an impulse sequence frequency. The impulse sequence frequency is proportional to a power value, which is related to an energy value, where the energy values are weighted in different manners, depending on tariffs, and if necessary, in accordance with a pre-determined impulse count of the impulse sequence.

In the aforementioned prior art, the final values of physical magnitudes, such as one or several electrical power and/or energy types, are determined in the first processor. In the event that subsequent changes and/or expansions of the electricity meters are required, it is highly probable that many of the calculations already made in the first processor will have to be repeated in the downstream second processor, or will have to be reversed, depending on product or country requirements, in order to generate the final additional physical magnitude, e.g., other energy types not yet determined in the electricity meter.

This leads to idling in the changed or expanded electricity meter, to unnecessary calculations, to losses in speed and time, and possibly to the utilization of additional memory in one or both processors.

Accordingly, it is an object of the present invention to realize a universal type of electricity meter which can be changed or expanded simply, and which avoids the aforementioned idling, unnecessary calculations, additional memory utilization, and speed and time losses in at least one of the two processors. It is a further object of the invention to realize such an electricity meter without requiring hardware and/or software changes in the first processor for the determination of final values of additional physical magnitudes not yet determined by the initial electricity meter design.

SUMMARY OF THE INVENTION

In accordance with an illustrative embodiment of the present invention, an electricity meter measures and processes electrical physical magnitudes of voltage and current input signals to derive various desired parameters and functions from the input signals. The electricity meter utilizes analog/digital converters, each corresponding to one of the voltage and/or current input signals, to transform scanned analog values into sampled digital values. These digital samples are inputted to a high speed first processor, which derives from them a number of auxiliary magnitudes, without the need of intermediate storage. While these auxiliary magnitudes have no direct physical significance, they are used by a slower speed second processor to mass compute the desired output parameters and functions. The inventive electricity meter is designed so that future changes or expansions of functionality will not require either hardware or software modifications to the first processor. An illustrative embodiment of the present invention is more fully described below in conjunction with the following drawings.

DETAILED DESCRIPTION OF THE INVENTION

In accordance with a preferred embodiment of the present invention, an electricity meter measures electrical physical magnitudes, which are either parameters, such as frequency and phase, or various functions of the input voltages and currents. The inventive electricity meter is provided with analog/digital converters, a first processor, and a downstream second processor. In a 3-phase electricity meter, the measured voltages $v_j$ and currents $i_j$ are preferably network phase voltages or network phase currents, where j=1, 2 and 3. The analog/digital converters serve to transform momentary analog values, i.e., scanned values of voltages $v_j$ and/or currents $i_j$, to digital sampling values $V_{j,n}$ and $I_{j,n}$, where n is a continuous number of scanned values, and is an integral value from 1 to N. The integral number N designates the number of scanned values which are measured per selected accumulation time.

Figure 1:
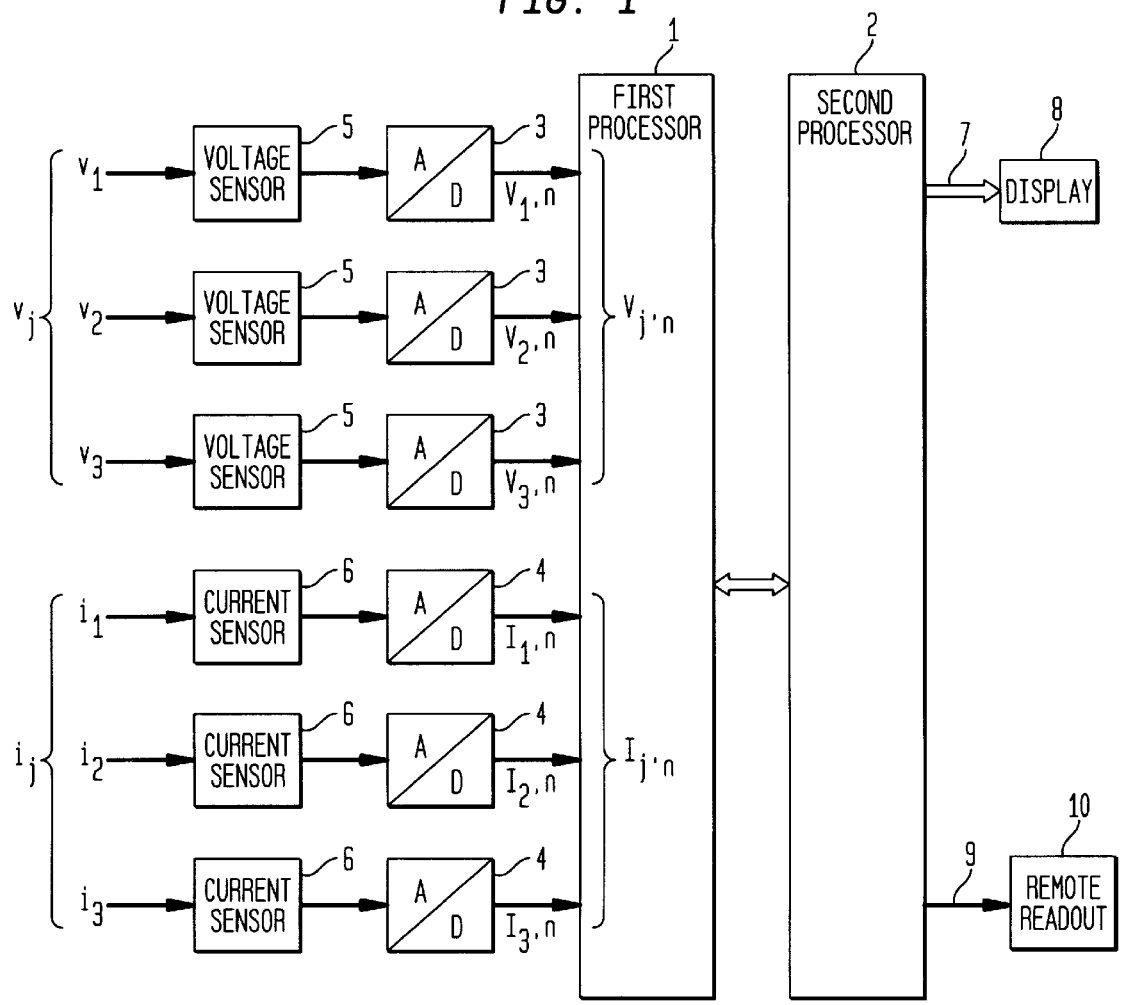
FIG. 1 shows a diagram of an electricity meter in accordance with the present invention.

FIG. 1 shows a 3-phase electricity meter, in accordance with the present invention, whose first processor 1 is connected via a bus connection to the downstream second processor 2. The three network phase voltages $v_j$, where j=1, 2 and 3, are each measured by means of a voltage sensor 5, the output of which is connected via one of three analog/digital converters 3 to a separate input of processor 1. A network phase current $i_j$ is associated with each voltage $v_j$. The three currents $i_j$, where j=1, 2 and 3, are each measured by means of a current sensor 6, whose output is connected via one of three analog/digital converters 4 to another separate input of the processor 1.

Instead of a total number of six separate analog/digital converters 3 and 4, or six separate inputs of processor 1, it is also possible to use multiplexers in combination with the analog/digital converters to reduce the number of analog/digital converters or the number of inputs to processor 1. For example, the outputs of the three sensors 5 or 6 may be connected via a multiplexer to an input of one single analog/digital converter 3 or 4. Alternately, the outputs of analog/digital converters 3 or 4 could be multiplexed to provide a single input to processor 1.

A bus output 7 from processor 2 is connected to a display 8, in order to display the electrical physical magnitudes to be measured. The digital values of the electrical physical magnitudes can also be brought out time-serially, via an output 9 of processor 2 to an output 10 of the electricity meter, for purposes of remote reading.

The first processor 1 serves to further process the digital values $V_{j,n}$ and $I_{j,n}$ into auxiliary magnitudes, where n=1 to N. The value of N is selected so that the second processor 2 requires only a reduced computing capacity in order to generate the desired output data from the auxiliary magnitudes provided by processor 1. The time interval between two successive input values to the second processor 2 is preferably ¼ second to 1 second.

The first processor 1 is a high speed processor, which performs complex computations on the digital values $V_{j,n}$ and $I_{j,n}$ (as shown below) without prior intermediate storage, to generate and store the auxiliary magnitudes. While these auxiliary magnitudes do not have any direct physical significance, their stored values are necessary to enable the relatively slow second processor 2 to compute the large quantities of electrical physical magnitude values desired. The first processor 1 is preferably capable of processing an 8-bit×8-bit multiplication in less than or equal to 50 nanoseconds. It is preferably a digital signal processor (DSP), which is relatively expensive and has a limited storage capacity. The second processor 2, on the other hand, is preferably suitable for mass processing of data, with a processing time for an 8-bit×8-bit multiplication of approximately 5 microseconds.

In multi-phase electricity meters, as shown in FIG. 1, the values of the electrical physical magnitudes to be measured are preferably values per phase, and/or total values of all phases together. The types of electrical physical magnitudes to be measured are preferably:

one or several types of electrical energy and/or electrical power, such as active energy, reactive energy, apparent energy, active power, reactive power and/or apparent power, one or several phase angles, each being present between one of the voltages $v_j$ and an appertaining current $i_j$, one or more phase angles which appear between two of the voltages $v_j$ or two of the currents $i_j$, Power factors λ, the voltages $v_j$ and/or the currents $i_j$, when their effective values are to be found in processor 2, whereby the values of one or several of the electrical physical magnitudes to be measured are effective values of the voltages $v_j$ and/or the currents $i_j$, frequencies of the voltages $v_j$ and/or of the currents $i_j$, in multi-phase electricity meters, a zero-conductor current and/or a zero-conductor voltage.

The aforementioned auxiliary magnitudes, which are calculated in the first processor 1, are preferably the accumulated values:

$$\sum_{n=1}^{N} \langle V_{j,n} \times I_{j,n} \rangle$$

and/or $$\sum_{n=1}^{N} \langle V^*_{j,n} \times I_{j,n} \rangle$$

and/or $$\sum_{n=1}^{N} \langle V_{j,n} \times I^*_{j,n} \rangle$$

and/or $$\sum_{n=1}^{N} \langle V^2_{j,n} \rangle$$

and/or $$\sum_{n=1}^{N} \langle I^2_{j,n} \rangle$$

and/or $$\sum_{n=1}^{N} \left\langle \sum_{j=1}^{3} I_{j,n} \right\rangle^2$$

where j=1, 2 and 3, whereby the latter value is useful only in three-phase electricity meters.

The designations $V^*_{j,n}$ and $I^*_{j,n}$ represent a preferred digital value at the output of a digital filter 12a (see FIG. 2), acting as a 90° phase advance/delay. Filter 12a receives the digital sampling values $V_{j,n}$, $I_{j,n}$ at its input. Alternately, voltages $V_{j,n}$ or currents $I_{j,n}$ may be inputted to other 90° phase advance/delay devices. The appertaining total values $$\sum_{n=1}^{N} \langle V^*_{j,n} \times I_{j,n} \rangle$$

or $$\sum_{n=1}^{N} \langle V_{j,n} \times I^*_{j,n} \rangle$$

serve e.g. to determine the reactive energy and/or reactive power in processor 2. The total value $$\sum_{j=1}^{3} I_{j,n}$$

in a three-phase arrangement with zero-conductor, is the sum of the scanned values of the three network phase currents $i_j$, and represents a scanned value of the zero-conductor current.

When the inventive electricity meter requires modification or expansion, it is only necessary to reprogram processor 2 in order to determine valid values of each physical magnitude desired. This is so because all the auxiliary magnitudes needed to compute these values have already been generated and stored in processor 1, and are made available to processor 2 with no further requirement for reversal of computations.

Figure 2:
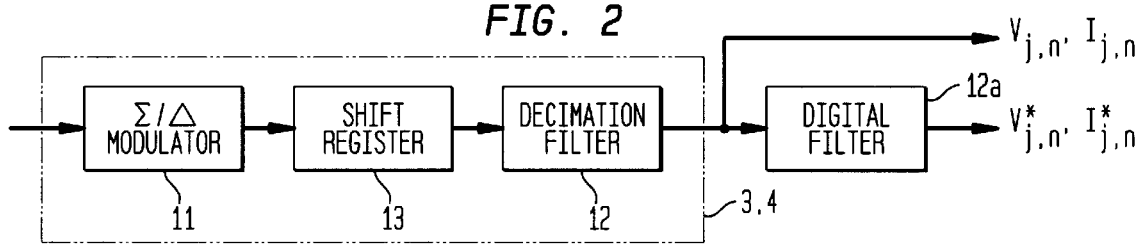
FIG. 2 shows a diagram of a preferred analog/digital converter in accordance with the present invention.

Each of the analog/digital converters 3 and 4 (FIG. 1) consists preferably of a sigma delta modulator 11 and a downstream decimation filter 12, as shown in FIG. 2. In addition, it is preferable to interpose a digitally controlled shift register 13 between sigma delta modulator 11 and downstream decimation filter 12 in order to compensate for time shifts, which may be produced when determining the currents.

Figure 3:
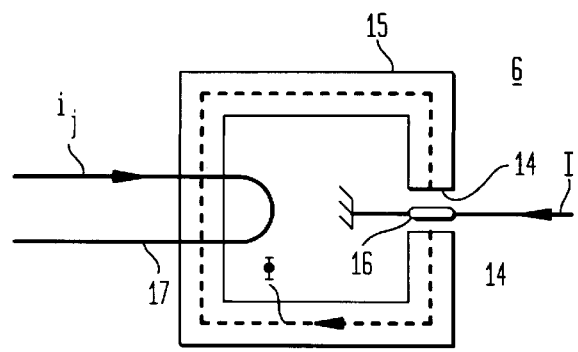
FIG. 3 shows the structure of a preferred current sensor in accordance with the present invention.

A current sensor 6 is provided per measured current $i_j$, as shown in FIG. 3. Current sensor 6 is preferably a current transformer, such as a Rogowski coil with downstream integrator (not shown), or a Hall element 16 (FIG. 3). The Hall element 16 is installed in an air gap 14 of a magnetic circuit 15, and is supplied with a constant current I. It measures the current $i_j$ by means of a proportional magnetic flow $\Phi$ produced in the magnetic circuit 15. The current $i_j$ flows through a conductor 17, which surrounds a leg of the magnetic circuit 15, e.g. in the form of a U. Alternately, the known Rogowski coil, or embedded coil (see U.S. Pat. No. 5,298,857 or U.S. Pat. No. 4,810,989), measures $di_j/dt$, a value which is then transformed into $i_j$ in the downstream integrator.

In short, an electricity meter is disclosed for measuring a wide variety of parameters and functions of input voltages and/or currents. Moreover, the disclosed electricity meter can be easily modified or expanded without requiring hardware or software changes in the first of two processors.

The above described embodiments of the invention are intended to be illustrative only. Numerous alternative embodiments may be devised by those skilled in the art without departing from the spirit and scope of the following claims.

We claim:

1. An electricity meter for measuring and processing electrical physical magnitudes of voltage and current input signals, comprising:

a quantity of analog/digital converters, each configured to receive a respective one of said voltage or current input signals, which transform scanned analog value samples of each of said voltage and current input signals into corresponding temporarily appearing digital values, a 90° phase advance/delay digital filter, a first processor which receives said temporarily appearing digital values and further processes each of said temporarily appearing digital values to derive a respective auxiliary magnitude value from each temporarily appearing digital value, wherein the auxiliary magnitude values include at least accumulated values $$\sum_{n=1}^{N} \langle V_{j,n}^* \times I_{j,n} \rangle$$

and/or $$\sum_{n=1}^{N} \langle V_{j,n} \times I_{j,n}^* \rangle$$

where n=1 to N, where $V_{j,n}$ and $I_{j,n}$ are said temporarily appearing digital values of the scanned analog values of said voltage and current input signals, said digital values $V_{j,n}$ and $I_{j,n}$ being inputted to said 90° phase advance/delay digital filter, where $V^*_{j,n}$ and $I^*_{j,n}$ are digital values at the output of said 90° phase advance/delay digital filter, where j=1 to the number of respective network phase voltages or currents, and where N is an integral number which designates a number of scanned analog values which are measured per a selected accumulation time, a second processor which receives said auxiliary magnitude values from said first processor, and utilizes said auxiliary magnitude values to measure said electrical physical magnitudes.

2. The electricity meter of claim 1, wherein said first processor has a processing time for an 8-bit×8-bit multiplication of less than or equal to 50 nanoseconds.

3. The electricity meter of claim 1, wherein said first processor is a high speed processor, which derives said auxiliary magnitude values directly from said temporarily appearing digital values without requiring prior intermediate storage.

4. The electricity meter of claim 1, wherein said second processor is slow relative to said first processor and suitable for mass processing of data, the processing time of said second processor for an 8-bit×8-bit multiplication being on the order of 5 microseconds.

5. The electricity meter of claim 1, further comprising a quantity of current sensors, each being associated with one of said analog/digital converters, which measure said current input signals, wherein each of said current sensors comprises a Hall element located in an air gap of a magnetic circuit, said Hall element being supplied with a constant current, in order to measure said current input signal by means of a proportional magnetic flow produced by said current input signal, flowing through a conductor surrounding a leg of said magnetic circuit, in said magnetic circuit.

6. The electricity meter of claim 1, further comprising a quantity of current sensors, each being associated with one of said analog/digital converters, which measure said current input signals, wherein each of said current sensors comprises a Rogowski coil with downstream integrator.

7. The electricity meter of claim 1, wherein each of said analog/digital converters comprises a sigma-delta modulator and a downstream decimation filter, each said analog/digital converter further comprising a digitally controlled shift register interposed between said sigma-delta modulator and said downstream decimation filter, to compensate for time shifts generated when measuring said current input signals.

8. The electricity meter of claim 1, wherein said electrical physical magnitudes to be measured include at least one type of electrical energy.

9. The electricity meter of claim 1, wherein said electrical physical magnitudes to be measured include at least one type of electrical power.

10. The electricity meter of claim 1, wherein said electrical physical magnitudes to be measured include phase angles between said voltage input signals and respective current input signals.

11. The electricity meter of claim 1, wherein said electrical physical magnitudes to be measured include phase angles between two of said voltage input signals.

12. The electricity meter of claim 1, wherein said electrical physical magnitudes to be measured include phase angles between two of said current input signals.

13. The electricity meter of claim 1, wherein said electrical physical magnitudes to be measured include power factors.

14. The electricity meter of claim 1, wherein said electrical physical magnitudes to be measured include frequencies of said voltage input signals.

15. The electricity meter of claim 1, wherein said electrical physical magnitudes to be measured include frequencies of said current input signals.

16. The electricity meter of claim 1, wherein said electricity meter is a multi-phase meter and said electrical physical magnitudes to be measured include a zero-conductor current.

17. The electricity meter of claim 1, wherein said electricity meter is a multi-phase meter and said electrical physical magnitudes to be measured include a zero-conductor voltage.

18. The electricity meter of claim 1, wherein said electrical physical magnitudes to be measured include effective values of said voltage input signals.

19. The electricity meter of claim 1, wherein said electrical physical magnitudes to be measured include effective values of said current input signals.

20. The electricity meter of claim 1, wherein said auxiliary magnitudes include accumulated values $$\sum_{n=1}^{N} \langle V_{j,n} \times I_{j,n} \rangle$$

and/or $$\sum_{n=1}^{N} \langle V_{j,n}^2 \rangle$$

and/or $$\sum_{n=1}^{N} \langle I_{j,n}^2 \rangle$$

where n 1 to N, and wherein $V_{j,n}$ and $I_{j,n}$ are said temporarily appearing digital values of the scanned analog values of said voltage and current input signals, where j=1 to the number of respective network phase voltages or currents, and where N is an integral number designating a number of scanned analog values which are measured per a selected accumulation time.

21. The electricity meter of claim 1, wherein said electricity meter is a 3-phase electricity meter and said auxiliary magnitudes include accumulated values $$\sum_{n=1}^{N} \left\langle \sum_{j=1}^{3} I_{j,n} \right\rangle^2$$

where n=1 to N and j=1 to 3, and wherein $I_{j,n}$ are said temporarily appearing digital values of the scanned analog values of said current input signals, and N is an integral number which designates a number of scanned analog values which are measured per selected a accumulation time.

22. The electricity meter of claim 1, wherein said electrical physical magnitudes to be measured includes of at least one of active energy, reactive energy, apparent energy, active power, reactive power, apparent power, effective voltage, effective current phase angle and power factor.

* * * * *